(12) United States Patent
Matsumora

(10) Patent No.: US 6,833,181 B2
(45) Date of Patent: Dec. 21, 2004

(54) CONDUCTIVE RESIN COMPOSITION AND CONTACT BOARD USING THE SAME

(75) Inventor: Satoru Matsumora, Miyagi-ken (JP)

(73) Assignee: ALPS Electric Co., Ltd., Tokyo (JP)

( * ) Notice: Subject to any disclaimer, the term of this patent is extended or adjusted under 35 U.S.C. 154(b) by 266 days.

(21) Appl. No.: 10/118,830

(22) Filed: Apr. 8, 2002

(65) Prior Publication Data

US 2003/0029541 A1 Feb. 13, 2003

(30) Foreign Application Priority Data

Apr. 25, 2001 (JP) .......................................... 2001-127584

(51) Int. Cl.⁷ ............................ C08K 3/08; H01B 1/22
(52) U.S. Cl. ...................... 428/221; 428/323; 428/328; 428/332; 428/357; 428/402; 174/1; 252/512; 252/514; 252/520.3

(58) Field of Search .................................. 252/500, 512, 252/514, 520.3; 428/221, 323, 328, 332, 357, 402; 174/1, 126.1, 137 B

(56) References Cited

FOREIGN PATENT DOCUMENTS

| JP | 6-11842 | 2/1994 | |
| JP | 94011842 B2 * | 2/1994 | ............ C08K/3/08 |

* cited by examiner

Primary Examiner—Sam Chuan Yao
(74) Attorney, Agent, or Firm—Beyer, Weaver & Thomas LLP

(57) ABSTRACT

The conductive resin composition contains silver powder that is a mixture of spherical particles and dendrite particles dispersed in binder resin, wherein the content (% by volume) of the spherical particle is larger than the content of the dendrite particle so that a conductive path is formed by silver powder of spherical particles, and dendrite particles are interposed between spherical particles.

3 Claims, 2 Drawing Sheets

CONDUCTIVE RESIN COMPOSITION AND CONTACT BOARD USING THE SAME

BACKGROUND OF THE INVENTION

1. Field of the Invention

The present invention relates to a conductive resin composition used suitably for electronic apparatus such as an encoder and a contact board that uses the same.

2. Description of the Related Art

Conventional conductive resin composition contains dispersed silver powder in binder resin wherein the silver powder in the conductive resin composition contributes to the conductivity of the conductive resin composition. Silver powder is formed in the shape of flake particle or dendrite particle to thereby increase the contact surface between silver powders and reduce the conduction resistance of the conductive path formed between silver powders.

A contact board to be mounted on an electronic apparatus such as an encoder is fabricated by forming a contact consisting of the abovementioned conductive resin composition on an insulation board, and it is required to cover the surface with carbon overcoat to prevent the silver powder from sulfurization.

However, the conventional conductive resin composition contains flake form or dendrite silver particles, such silver particle having complex configuration is not easily mixed with binder resin. As the result, the silver powder content is limited at most to approximately 30 to 35% in volume, and it is difficult to improve the conductivity further. Furthermore, not only a contact consisting of the conventional conductive resin composition requires carbon overcoat but also the carbon overcoat causes the increased contact resistance of a contact board in contact with a contact brush.

SUMMARY OF THE INVENTION

The object of the present invention is to provide sulfurization-resistant conductive resin composition that requires no carbon overcoat and additionally that is excellent in wear resistance, and to provide a contact board formed of the conductive resin composition.

Conductive resin composition contains silver powder that is a mixture of spherical particles and dendrite particles dispersed in binder resin, wherein the content (% by volume) of the spherical particle is larger than the content of the dendrite particle.

The conductive resin composition as described hereinabove is rendered conductive by the silver powder, and the binder resin binds the silver powder. The silver powder of spherical particles forms a conductive path in the conductive resin composition, and furthermore dendrite particles are interposed between spherical particles to thereby increase the electrical contact point between spherical particles, and as the result the conduction resistance is reduced. Furthermore, because the silver powder contains a lot of spherical particles of simpler configuration, the binder resin binds the silver powder easily, and it is possible to improve the sulfurization resistance of the conductive resin composition by increasing the content of the silver powder.

The conductive resin composition of the present invention contains the binder resin and silver powder, and the content of the silver powder ranges from 40 to 50% by volume.

In the conductive resin composition as described hereinabove, because the content of the silver powder is equal to or larger than 40% by volume, the sufficient conductivity is obtained, and because the content of the silver powder is equal to or smaller than 50% by volume, the binder resin can maintains the force to bind the silver powder.

In the conductive resin composition, the content of the silver powder of the dendrite particle ranges from 5 to 18% by volume, and the content ratio of the silver powder of the spherical particle to the silver powder of the dendrite particle ranges from 1.5 to 7.

Because the content of the dendrite particle is equal to or smaller than 18% by volume in the conductive resin composition as described hereinabove, the binder resin binds the silver powder easily. Furthermore, the content ratio of the spherical particle to the dendrite particle ranges from 1.5 to 7 and the content of the dendrite particle is equal to or larger than 5% by volume, sufficient dendrite particles are interposed between spherical particles, and the conduction resistance of the conductive path between spherical particles is reduced.

The conductive resin composition of the present invention contains the silver powder that is a mixture of the spherical particle having an average particle diameter of 3 to 6 $\mu$m and the dendrite particle having an average particle diameter equal to or smaller than 1 $\mu$m.

In the conductive resin composition as described hereinabove, dendrite particles fills the space between spherical particles sufficiently.

A contact board of the present invention is provided with an insulating board on which a contact comprising any one of the abovementioned conductive resin compositions is formed.

Because such a contact of a contact board is excellent in the sulfurization resistance, it is not necessary to provide a carbon overcoat for preventing the sulfurization and the contact resistance due to contact with a contact brush overcoated by the carbon overcoat is reduced, and a fine contact pattern can be formed. Because the contact is excellent in the conductivity, the conduction resistance between the contact and a contact brush is low, and the reliability of an electronic apparatus that is provided with the contact of the present invention is improved. Furthermore, because the contact is excellent in the wear resistance, a long life electronic apparatus is realized.

The contact of a contact board of the present invention is formed by means of heat pressing technique.

In such a contact board, air holes formed in the contact during a screen printing process are squeezed out to form a dense and hard film with improved wear resistance, and the sulfurization resistance is improved because the space through which sulfurization atmosphere penetrates is eliminated, and furthermore silver powders come closer to each other to result in increased conductivity.

The contact is formed by means of heat pressing technique by applying a heat pressing condition of a heating temperature ranging from 175 to 185° C., a pressure ranging from 80 to 200 kg/cm$^2$ and a heat pressing time ranging from 15 seconds to 3 minutes.

The insulating board of such a contact board is prevented from being deformed and thermally deteriorated, and the contact surface is finished smooth. The smooth surface of the contact mounted on an electronic apparatus prevents the noise that occurs when the contact brush rides on the rough surface of the contact, and the reliability of the electronic apparatus is improved.

DESCRIPTION OF THE PREFERRED EMBODIMENTS

Figure 1:
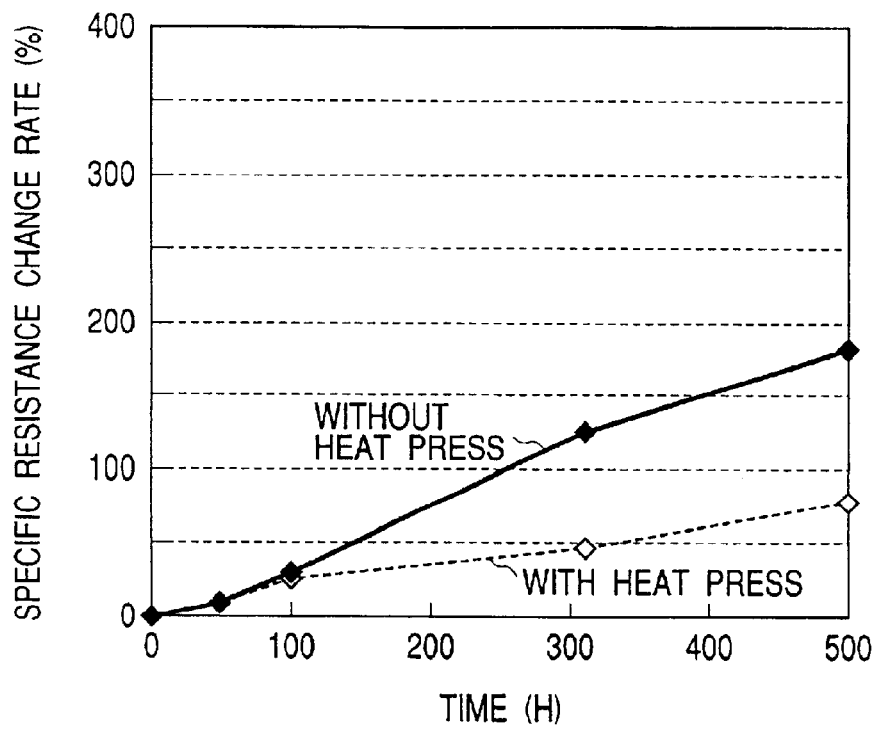
FIG. 1 is a graph showing the sulfurization resistance of a contact consisting of a conductive resin composition of the present invention.

The conductive resin composition of the present invention contains silver powder dispersed in binder resin, and the content of silver powder to the whole ranges from 40 to 50% by volume.

The binder resin functions to bind silver powder, and furthermore to increase the contact pressure between silver powders due to hardening shrinkage to thereby reduce the contact resistance between silver powders and to improve the conductivity of the conductive resin composition.

Thermosetting resin is used preferably as the binder resin because softening due to atmospheric temperature and frictional heat is prevented. Particularly, phenol base resin is preferably used as the binder resin because phenol base resin improves the adhesion between a board and conductive resin composition because of the suitable quantity of hydrogen bonding functional group (hydroxyl group, or amino group) contained in the resin structure. Examples of phenol resin include, for example, resol-type phenol resin, novolak-type phenol resin, phenol-aralkyl resin, xylene-modified phenol resin, cresol-modified phenol resin, furan-modified phenol resin, epoxy-phenol resin, phenol-melamine resin, phenol-carbodiimide resin, and resorcinol-modified phenol resin, and any of these resins may be used.

Silver powder contributes to the conductivity of the conductive resin composition. The silver powder mixedly contains spherical particles and dendrite particles. The spherical particle has undefined form and has an average particle diameter of 3 to 6 $\mu$m, and the content to the whole conductive resin composition ranges from 25 to 43.75% by volume. The dendrite particle has an average particle diameter equal to or smaller than 1 $\mu$m, and the content to the whole conductive resin composition ranges 5.63 to 15% by volume.

The volume % of the spherical particle is larger than the volume % of the dendrite particle, and the volume ratio of the spherical particle to the dendrite particle ranges from 1.67 to 7.

Conductive paths of the conductive resin composition are formed of the contact between spherical particles of the silver powder, and the dendrite particle is interposed between spherical particles to thereby increase the contact point between silver powders and to reduce the concentrated contact resistance of the conduct path resultantly.

The reason why the content of silver powder to the whole conductive resin composition can be increased to a value of 40 to 50% by volume is that the volume ratio of the spherical particle of the silver powder to the dendrite particle is as high as 1.67 to 7 and the spherical particle is easily bound with binder resin because the configuration of the spherical particle is simpler than that of the dendrite particle.

The large content of the spherical particle results in an increase of conductive paths, improved conductivity, and furthermore a dense and complex conductive path. A plurality of loop conductive paths that do not contribute to the conductivity of the whole conductive resin composition, bypass conductive paths connected to the adjacent conductive paths, and dead end conductive paths that do not contribute to the conductivity at all are formed, and these paths contribute to preventing the silver powder from sulfurization as described hereinafter.

When the conductive resin composition is exposed to sulfurization atmosphere, one contact point in the conductive paths that contribute to the conductivity of the resin composition actually is insulated to result in the reduction of the conductivity of the resin composition. In the conductive path formed by spherical particles, even though the conductive path is sulfurized partially, the conduction path is compensated with the loop conduction path, or the bypass conductive path functions as the active conductive path because the conductive path is dense and complex. As the result, the reduction of the conductivity of the whole conductive resin composition is not significant even though one contact point in the conductive path is insulated.

Furthermore, the dead end conductive path that does not contribute to the conductivity functions to slow down the rate of sulfurization. Therefore, the content of more silver powder in the conductive resin composition results in the improved sulfurization resistance.

A whisker additive may be added in addition to the binder resin and silver powder in the conductive resin composition. Such additives functions to render the conductive ink thixotropic to result in the improved screen printing precision in a printing process of the conductive resin composition.

Figure 4:
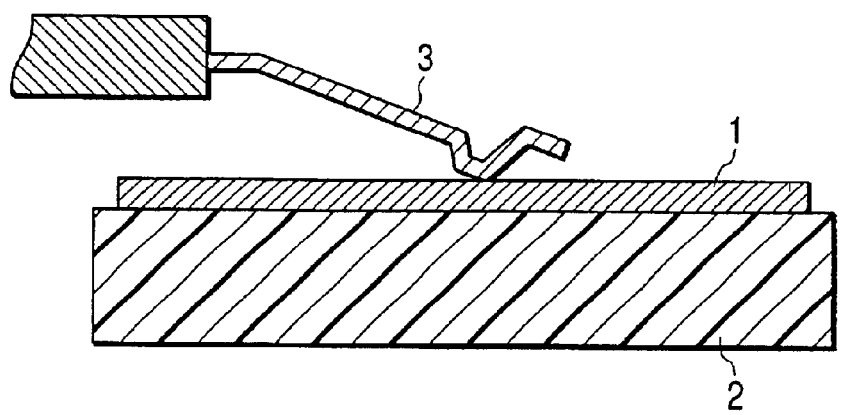
FIG. 4 is a cross sectional view of a contact board of the present invention.

A contact board of the present invention is fabricated by forming a contact 1 consisting of the abovementioned conductive resin composition on an insulating board 2 as shown in FIG. 4. Such a contact board is mounted on an electronic apparatus such as encoder, and a contact brush 3 consisting of metal slides on the contact board and can be in contact with the contact 1.

In the case of such a contact board, it is not required to cover the contact 1 with carbon overcoat to prevent sulfurization because the contact 1 is excellent in the sulfurization resistance. As the result, the contact resistance between the contact brush 3 and the contact 1 due to carbon overcoat is low, and furthermore it is possible to reduce the size of the contact pattern.

Furthermore, because the contact 1 is excellent in the conductivity, the conduction resistance between the contact 1 and the contact brush 3 is low, the reliability of the electronic apparatus is improved, and the electronic apparatus is rendered long life because the wear resistance of the contact 1 is high.

A manufacturing process of the contact board of the present invention will be described hereinafter. A conductive ink containing silver powder that is the mixture of spherical particles and dendrite particles dispersed in a resin solution formed by dissolving phenol base resin in an organic solvent such as Carbitol is prepared. The conductive ink is printed so as to form a desired configuration on an insulating board 2 by means of screen printing technique.

Next, in a drying process, the conductive ink formed on the insulating board 2 is dried, the organic solvent is removed from the conductive ink, and the contact 1 consisting of the conductive resin composition is formed and a contact board is completed.

Furthermore, in a heat pressing process, the contact board is pressed with heating to improve the conductivity, wear resistance, and sulfurization resistance of the contact 1 after the drying process of the conductive ink.

A mold used for heat pressing process has a structure having a pair of mirror surfaces that are faced each other. In the heat pressing process, the contact board is placed between the mirror surfaces of a heat pressing mold, and the contact board is pressed with heating between the mirror surfaces of the mold.

In such a heat pressing process, air holes formed in the contact 1 during screen printing are squeezed and the contact 1 becomes a dense and hard film, the wear resistance is improved, the sulfurization resistance is improved because there is no space through which sulfurization atmosphere penetrates, and furthermore silver particles are brought into contact or come close to each other to bring about the increased conductivity of the contact 1.

Furthermore, even in the case where spherical particles project on the surface of the contact 1 after printing and drying process, the projected spherical particles are pressed into the internal of the contact 1 and the surface of the contact 1 is finished smooth. The smooth surface of the contact 1 prevents the noise that occurs when the contact brush 3 rides on the rough surface of the contact 1, and the reliability of the electronic apparatus is improved.

In the heat pressing process, the pressing pressure ranges from 80 to 200 kg/cm² and the heating temperature ranges from 175 to 185° C., the heat pressing time ranges 15 seconds to 3 minutes, wherein the heat pressing time can be shortened as the pressing pressure and/or heating temperature are higher.

If the heating temperature and the pressing pressure are too high, the insulating board 2 is deformed depending on the case, on the other hand if the heating temperature and pressing pressure are too low, the surface of the contact 1 is not sufficiently smooth. Furthermore, if the heat pressing time is too long, the surface of the insulating board 2 is thermally decomposed, on the other hand if the heat pressing time is too short, the surface of the contact 1 is not sufficiently smooth. The pressing pressure of 150 kg/cm² and the heating temperature of 180° C., and the heating pressing time of 1 minute are employed as the optimal heat pressing process condition.

EXAMPLES

The content (% by volume) of resol-type phenol binder resin, spherical silver particle powder, dendrite silver particle powder, and additive consisting of metal oxide whisker in conductive resin compositions corresponding to examples 1 to 7 and the specific resistance of the respective conductive resin compositions are listed in Table 1.

TABLE 1

| | Conductive Resin Composition Ratio (% by volume) | | | | Specific Resistance Conductive Resin Compositions ($\times 10^{-4}$ Ω·Cm) |
|---|---|---|---|---|---|
| | Binder Resin | Spherical Silver Particle Powder | Dendrite Silver Particle Powder | Additive | |
| Example 1 | 50 | 43.75 | 6.25 | — | 1.353 |
| Example 2 | 55 | 25.00 | 15.00 | 5.00 | 3.182 |
| Example 3 | 55 | 28.13 | 16.88 | — | 4.196 |
| Example 4 | 55 | 39.38 | 5.63 | — | 1.632 |
| Example 5 | 60 | 25.00 | 15.00 | — | 1.833 |
| Example 6 | 60 | 30.00 | 10.00 | — | 3.907 |
| Example 7 | 60 | 35.00 | 5.00 | — | 5.554 |

The content of silver powder to the whole volume ranges from 40 to 50% by volume, the content of dendrite silver particle powder to the whole volume ranges from 5 to 17% by volume, and the volume ratio of the spherical particle to the dendrite silver particle ranges from 1.6 to 7 in Examples 1 to 7. Furthermore, Example 2 contains additive consisting of metal oxide whisker.

In the case of Examples 1 to 7, the specific resistance ranges in the order of $10^{-4}$ Ω·cm, and Examples 1 to 7 are excellent in the conductivity.

The content (% by volume) of resol-type phenol binder resin, spherical silver particle powder and dendrite silver particle powder in conductive resin compositions corresponding to Comparative Examples 1 to 10 and the specific resistance of the respective conductive resin compositions are listed in Table 2.

TABLE 2

| | Conductive Resin Composition Ratio (% by volume) | | | Specific Resistance Conductive Resin Compositions ($\times 10^{-4}$ Ω·Cm) |
|---|---|---|---|---|
| | Binder Resin | Spherical Silver Particle Powder | Dendrite Silver Particle Powder | |
| Comparative Example 1 | 50 | 31.25 | 18.75 | — |
| Comparative Example 2 | 60 | 0 | 40 | — |
| Comparative Example 3 | 60 | 5.00 | 35.00 | — |
| Comparative Example 4 | 60 | 10.00 | 30.00 | — |
| Comparative Example 5 | 60 | 15.00 | 25.00 | — |
| Comparative Example 6 | 60 | 20.00 | 20.00 | — |
| Comparative Example 7 | 65 | 21.88 | 13.13 | 11.72 |
| Comparative Example 8 | 65 | 30.63 | 4.38 | 12.09 |
| Comparative Example 9 | 70 | 18.75 | 11.25 | 15.63 |
| Comparative Example 10 | 70 | 26.25 | 3.75 | 37.85 |

In the case of Comparative Examples 1 to 6, the content of silver powder ranges from 40 to 50% by volume, and the content of the dendrite silver particle powder to the whole volume ranges from 18.75 to 40% by volume. Furthermore, in the case of Comparative Examples 7 to 10, the content of silver powder ranges from 30 to 35% by volume.

In the case of Comparative Examples 1 to 6 in which the content in % by volume of the dendrite silver particle powder to the whole volume is large, the binder resin binds silver powder insufficiently, and the conductive ink is not formed. Furthermore, in the case of Comparative Examples 7 to 10 in which the content in % by volume of silver powder is small, the specific resistance of these conductive resin compositions is higher than the case of Examples, and ranges in the order of $10^{-3}$ Ω·cm.

Figure 2:
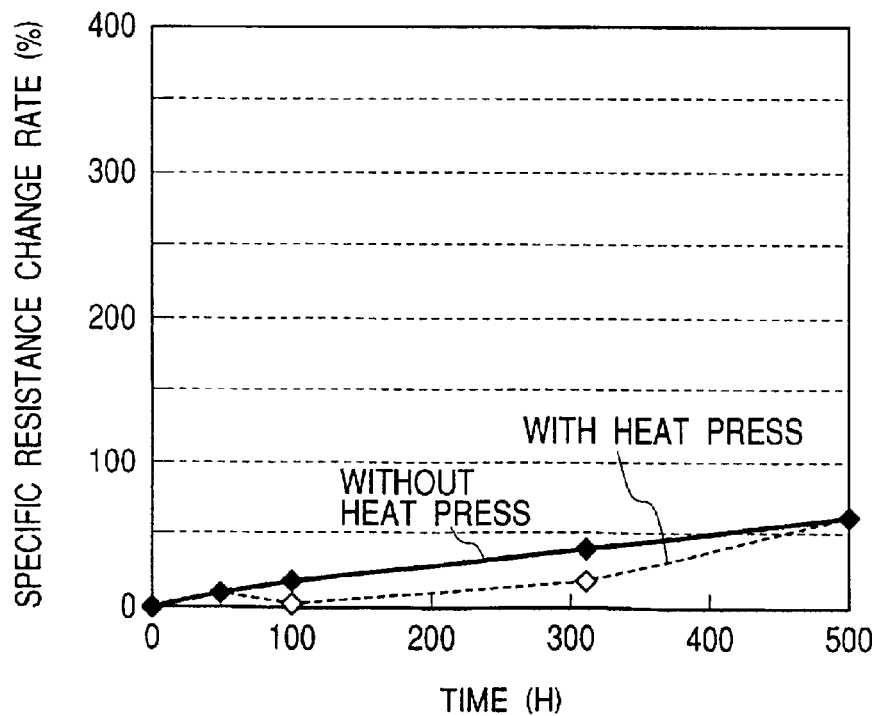
FIG. 2 is a graph showing the sulfurization resistance of a contact consisting of a conductive resin composition of the present invention.

Graphs shown in FIG. 1 and FIG. 2 show the specific resistance change over time of contacts during exposure to sulfurization atmosphere (hydrogen sulfide concentration of 1 ppm, at a temperature of 40° C. and a humidity of 75% RH). The contacts have been formed by heat pressing the conductive resin compositions of Example 2 and Example 5 (listed in Table 1) with a pressing pressure of 150 kg/cm$^2$, at a heating temperature of 180° C. for a heat pressing time of 1 minute.

As it is obvious from the graphs shown in FIG. 1 and FIG. 2, in the case of the contacts of Example 2 and Example 5, the specific resistance change over time in the sulfurization atmosphere is suppressed by heat pressing and the sulfurization resistance is further improved.

Comparative Example 11 is a case in which flake silver powder is used instead of the spherical silver powder of the composition of Example 2, and the content of the resol-type phenol binder resin, dendrite silver powder, additive consisting of metal oxide whisker is the same as that used in Example 2.

Figure 3:
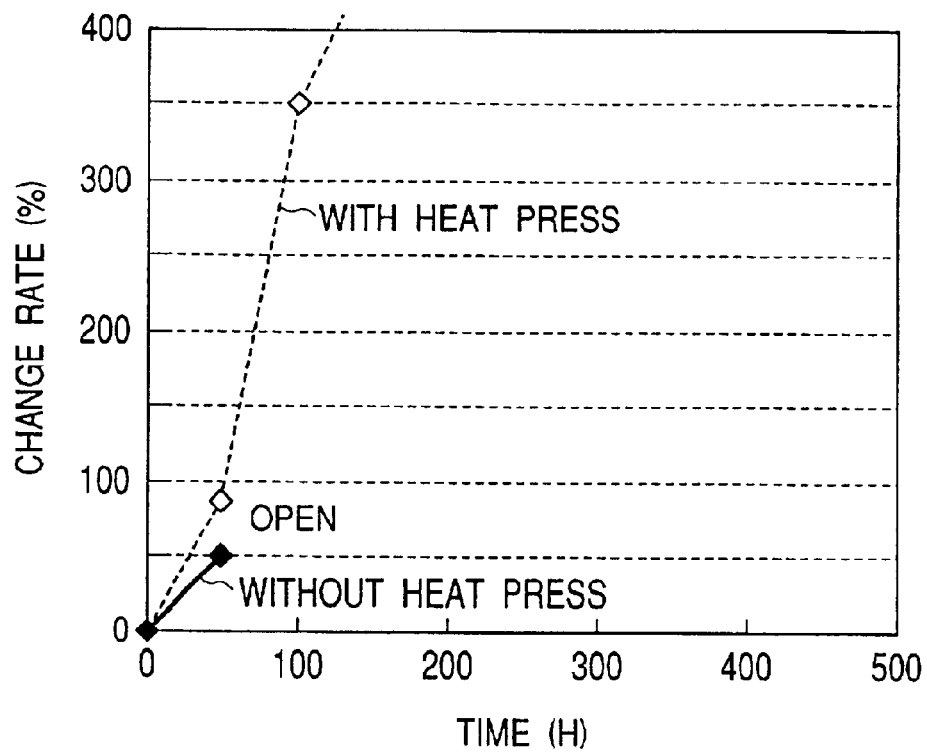
FIG. 3 is a graph showing the sulfurization resistance of a contact consisting of a conductive resin composition of a comparative example.

A graph shown in FIG. 3 shows the specific resistance change over time of contact during exposure to sulfurization atmosphere. The contact has been formed by heat pressing the conductive resin compositions of Comparative Example 11 with a pressing pressure of 150 kg/cm$^2$, at a heating temperature of 180° C. for a heat pressing time of 1 minute.

As it is obvious from the graph shown in FIG. 3, in the case of the contact of Comparative Example 11, the contact loses the conductivity within several tens hours in the case where it has not been heat pressed, but maintains the conductivity for a time longer than 100 hours in the case where it has been heat pressed.

The conductive resin composition of the present invention contains silver powder that is a mixture of spherical particles and dendrite particles dispersed in a binder resin, wherein the volume % content of the spherical particle is larger than the content of the dendrite particle.

The silver powder renders the conductive resin composition conductive, and binder resin binds the silver powder. The spherical silver particle powder forms conductive path in the conductive resin composition, and the dendrite particle is interposed between spherical particles to bring about increased electrical contact point between spherical particles, and as the result the conduction resistance is reduced. Furthermore, because silver powder contains a lot of spherical particles having a simpler configuration, binder resin binds the silver powder easily. Therefore, it is possible to improve the sulfurization resistance of the conductive resin composition by increasing the content of silver powder.

The contact board of the present invention is fabricated by forming a contact consisting of any one of the abovementioned conductive resin compositions on an insulating board.

Because such a contact board is excellent in the sulfurization resistance of the contact, it is not necessary to provide a carbon overcoat for covering the contact to prevent sulfurization. Therefore, there is no increase in contact resistance between the contact board and a contact brush overcoated by the carbon overcoat, and a fine contact pattern can be formed. Because the contact is excellent in the conductivity, the conduction resistance between the contact and a contact brush is low, the reliability of the electronic apparatus is improved and the electronic apparatus is rendered long life because of the high wear resistance of the contact mounted on the electronic apparatus.

The contact of the contact board of the present invention is formed by means of heat pressing technique.

In the case of such a contact board, air holes formed in the contact during screen printing are squeezed to form a dense and hard film. As the result, the wear resistance is improved and the space through which sulfurization atmosphere penetrates is eliminated. Therefore, the sulfurization resistance is improved and silver powders come close to each other to bring about the improved conducitivty.

What is claimed is:

1. A contact board having an insulating board on which a contact comprising a conductive resin composition containing silver powder including a mixture of spherical particles and dendrite particles dispersed in binder is formed, wherein the content (% by volume) of the spherical particle is larger than the content of the dendrite particle, and wherein the average particle diameter of the silver powder of the spherical particle ranges from 3 to 6 μm, and wherein the average particle diameter of the dendrite particle is equal to or smaller than 1 μm.

2. The contact board according to claim 1, wherein the conductive resin composition comprising the binder resin and the silver powder, and wherein the content of the silver powder ranges from 40 to 50% by volume.

3. The contact board according to claim 1, wherein the content of the silver powder of the dendrite particle ranges from 5 to 18% by volume, and wherein the content ratio of the silver powder of the spherical particle to the silver powder of the dendrite particle ranges from 1.5 to 7.

* * * * *